(12) United States Patent
Suzuki

(10) Patent No.: US 6,992,511 B2
(45) Date of Patent: Jan. 31, 2006

(54) OUTPUT BUFFER CIRCUIT

(75) Inventor: Toyoki Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/372,102

(22) Filed: Feb. 25, 2003

(65) Prior Publication Data

US 2003/0164723 A1  Sep. 4, 2003

(30) Foreign Application Priority Data

Mar. 4, 2002  (JP)  ............................ 2002-057543

(51) Int. Cl.
*H03B 1/00* (2006.01)
(52) U.S. Cl. ...................................... 327/112; 327/170
(58) Field of Classification Search ................ 327/108, 327/112, 170, 389, 391, 376, 377; 326/83, 326/87, 30, 26, 27
See application file for complete search history.

(56) References Cited

U.S. PATENT DOCUMENTS 5,206,544 A * 4/1993 Chen et al. .................. 326/30
5,623,216 A * 4/1997 Penza et al. ................. 326/27
5,923,192 A * 7/1999 Hasegawa ................... 327/112
6,051,995 A * 4/2000 Pollachek .................... 326/87
6,535,020 B1 * 3/2003 Yin ............................. 326/83

FOREIGN PATENT DOCUMENTS

| JP | 04-192808 | 7/1992 |
| JP | 06-112780 | 4/1994 |
| JP | 09-284111 | 10/1997 |

* cited by examiner

*Primary Examiner*—Long Nguyen
(74) *Attorney, Agent, or Firm*—Arent Fox PLLC

(57) ABSTRACT

There is provided an output buffer circuit which can realize high speed voltage transition of an output signal while generation of noise due to signal transition is suppressed. On the occasion of driving a PMOS transistor P1, in the period of the state I, when the NMOS transistor N11 and NMOS transistors N12, N13 are turned ON, voltage of the output stage PMOS gate terminal AP1 is sharply dropped and the PMOS transistor P1 is turned ON. While the signal is propagated in the shortest delay time to the circuit of next stage, when the NMOS transistor N11 and NMOS transistor N12 are turned ON in the state II, disturbance of signal waveform can be suppressed by limiting a through-rate of the voltage drop of the output stage PMOS gate terminal AP1. Driving capability of the PMOS transistor P1 can be variably controlled by controlling the bias condition of a control signal AP1 by switching, for every state, the NMOS transistors N12 to N14 which are turned ON.

14 Claims, 8 Drawing Sheets

OUTPUT BUFFER CIRCUIT DIRECTED TO FIRST EMBODIMENT

FIG.1 OUTPUT BUFFER CIRCUIT DIRECTED TO FIRST EMBODIMENT

FIG.2

STATE TRANSITION TABLE OF TRANSISTORS IN BIAS CONTROL SECTION DIRECTED TO FIRST EMBODIMENT

|     | N11 | N12 | N13 | N14 |
|-----|-----|-----|-----|-----|
| I   | ON  | ON  | ON  | OFF |
| II  | ON  | ON  | OFF | OFF |
| III | ON  | ON  | OFF | ON  |

OPERATIONAL WAVEFORM DIRECTED TO FIRST EMBODIMENT

FIG.4 OUTPUT BUFFER CIRCUIT DIRECTED TO SECOND EMBODIMENT

FIG.5

STATE TRANSITION TABLE OF TRANSISTORS IN BIAS CONTROL SECTION DIRECTED TO SECOND EMBODIMENT

|     | N11 | N12 | N13 | N14 |
|-----|-----|-----|-----|-----|
| I   | ON  | ON  | OFF | ON  |
| II  | ON  | ON  | ON  | ON  |
| III | ON  | ON  | ON  | OFF |

OPERATIONAL WAVEFORM DIRECTED TO SECOND EMBODIMENT

EXAMPLE OF CIRCUIT THAT ADJUSTS DELAY TIME

ADJUSTED WITH ADJUSTING SIGNAL

ADJUSTED BY FUSE CUTOUT

CONVENTIONAL OUTPUT CIRCUIT

OUTPUT BUFFER CIRCUIT

CROSS-REFERENCE TO RELATED APPLICATIONS

This application is based upon and claims the benefit of priority from each of the prior Japanese Patent Application No. 2002-57453 filed on Mar. 4, 2002, the entire contents of which are incorporated herein by reference.

BACKGROUND OF THE INVENTION

1. Field of the Invention

The present invention relates to an output buffer circuit which is formed of semiconductor devices and particularly to an output buffer circuit which realizes voltage transition of a high speed output signal while generation of noise due to signal transition is suppressed.

2. Description of Related Art

In recent years, data processing velocity in an information processor such as a personal computer or the like is more and more improved and data transfer is executed via a high speed data bus such as PCI bus. Therefore, an output buffer circuit which is formed of semiconductor devices for driving these data buses is requested to drive the data bus in higher velocity. In order to drive data bus in higher velocity, it is required to transit in higher velocity a voltage level of the signal on the data bus and suppress erroneous detection of signal in the receiving side of the next stage such as over-shoot and under-shoot of voltage level due to the high speed voltage transition of signal and also to suppress disturbance of signal waveform which may result in noise to peripheral circuits. Therefore, it is required to control voltage transition characteristic of signal.

As the related art utilizing a circuit configuration which provides an output while controlling voltage transition of signal, the JP Laid-open Patent Publication No. 9-284111, for example, is disclosed. An output circuit of this circuit configuration is illustrated in FIG. 8. This output circuit includes at least a pull-up PMOS transistor 100 of the output stage, a plurality of pull-down NMOS transistors 200, 300 of the output stage respectively connected in the drains thereof to the drain of the pull-up PMOS100 and a drive circuit 2000 of the preceding stage for driving the pull-down NMOS transistors 200, 300 of the output stage.

The pull-down NMOS transistors 200, 300 of the output stage described above turn ON when the signal D becomes LOW level. Here, it should be noted that the gate of the pull-down NMOS transistor 200 of the output stage is driven with the signal D via a delay circuit 1000, a 3-input NAND900 and an inverter 800, while the gate of the NMOS transistor 300 of the output stage is driven with the signal D via the delay circuit 1000, 3-input NAND900, a delay circuit 1300, a 2-input NAND 1100 and an inverter 1400. Therefore, the NMOS transistor 300 turns ON after the NMOS transistor 200 turns ON. Thereby, a falling waveform of the output DOUT is rounded.

The output circuit of FIG. 8 of the related art is provided with a plurality of pull-down NMOS transistors 200, 300 of the output stage. In order to turn ON these transistors, the NMOS transistor 200 is turned ON first with a signal which is sequentially delayed and thereafter the NMOS transistor 300 is turned ON. Thereby, this configuration is capable of rounding a falling waveform of the output DOUT by switching over the driving capability.

However, since the driving capability is changed over by sequentially turning ON or OFF a plurality of pull-down NMOS transistors 200, 300 of the output stage, the current driving capability of the NMOS transistors as a whole in the ON state changes non-continuously after or before the NMOS transistors which are sequentially turned ON. In other words, a total sum of conductive resistance of NMOS transistors changes non-continuously. For example, in the case of configuration where two NMOS transistors of the same size are provided and these are sequentially turned ON, when the second NMOS transistors turns ON or OFF, the conductive resistance suddenly changes in the half or doubled changing rate.

Sudden change of current driving capability when the number of transistors of the output stage in the ON state is changed in the transit condition of voltage transition of signal and non-continuous change of conductive resistance depending on the change described above results in sudden change of characteristic impedance on a signal propagation path including an input impedance of the transmission line including data bus and the circuit in the receiving side of the next stage. Accordingly, there rises a fear for generation of disturbance of waveform such as over-shoot and under-shoot of the signal waveform. Disturbance of this signal waveform results in the problem that erroneous detection of signal is generated in the circuit of the receiving side or noise is also generated in the peripheral circuits.

Moreover, in order to suppress disturbance of signal waveform, voltage transition velocity of signal must be restricted. In this case, signal propagation velocity is restricted and thereby propagation delay is probably increased. In general, high speed operation in which propagation delay of signal is shortened is in the trade-off relationship to the stable operation in which disturbance of signal waveform such as over-shoot and under-shoot is suppressed and therefore it is requested to adjust both characteristics. It will become a problem if both characteristics cannot be adjusted under the condition that the high speed data transmission is more and more requested.

SUMMARY OF THE INVENTION

The present invention has been proposed to overcome at least one of problems of the related art and it is therefore an object of the present invention to provide an output buffer circuit which can realize voltage transition of a high velocity output signal while suppressing generation of noise due to the signal transition.

In view of achieving the object described above, the output buffer circuit according to one aspect of the present invention is characterized in comprising an output section for driving an output terminal to output a binary signal to the predetermined voltages and a bias control section for variably controlling driving capability of the output section by variably controlling a bias to drive the output section during the transition period where the output terminal reaches the predetermined voltages.

In the output buffer circuit according to one aspect of the present invention, driving capability of output section to drive the output terminal during the transition period where the output terminal reaches the predetermined voltage is variably controlled with a bias which is variably controlled by the bias control section.

Accordingly, the driving capability of output section during the voltage transition where the output terminal reaches the predetermined voltage can be variably controlled by controlling a bias to the output section. Adjustment of bias enables accurate adjustment of driving capability of the output section depending on the transition condition where the output terminal reaches the predetermined voltage and moreover acquisition of the excellent voltage transition characteristic.

Moreover, an output buffer circuit according to another aspect of the present invention is characterized in comprising the first output section for driving an output terminal which outputs a binary signal to the first predetermined voltage, the second output section for driving the output terminal to the second predetermined voltage, the first bias control section for variably controlling the driving capability of the first output section by variably controlling a first bias to drive the first output section during the voltage transition period where the output terminal reaches the first predetermined voltage, the second bias control section for variably controlling driving capability of the second output section by variably controlling a second bias to drive the second output section during the voltage transition period where the output terminal reaches the second predetermined voltage, the first non-drive control section which is driven simultaneously with the first bias control section for not driving the second output section by controlling the second bias before the first output section is driven and the second non-drive control section which is driven simultaneously with the second bias control section for non-driving the first output section by controlling the first bias before the second output section is driven.

In the output buffer circuit according to another aspect of the present invention, driving capability of the first output section which drives the output terminal during the voltage transition period where the output terminal reaches the first predetermined voltage is variably controlled by the first bias which is variably controlled by the first bias control section. Moreover, in this case, the first non-drive control section which does not drive the second output section by controlling the second bias before the first output section is driven is driven simultaneously with the first bias control section. In the same manner, driving capability of the second output section which drives the output terminal during the voltage transition period where the output terminal reaches the second predetermined voltage is variably controlled by the second bias which is variably controlled by the second bias control section. Moreover, in this case, the second non-drive control section which does not drive the first output section by controlling the first bias before the second output section is driven is driven simultaneously with the second bias control section.

Therefore, driving capability of the first or second output section during the voltage transition period where the output terminal reaches the first or second predetermined voltage can be variably adjusted by controlling the first or second bias to the first or second output section. Adjustment of the first or second bias enables accurate adjustment of driving capability of the first or second output section depending on the voltage transition condition where the output terminals reaches the first or second predetermined voltage and also enables acquisition of the excellent voltage transition characteristic.

Moreover, since the second or first output section is not driven by controlling the second or first bias with the first or second non-drive control section before the first or second output section is started to be driven through the first or second bias to the first or second output section, the first and second output sections are never driven simultaneously and thereby a through-current between the first and second predetermined voltages can be suppressed.

In this case, the first or second bias control section for driving the first or second output section and the first or second non-drive control section for not driving the second or first output section are driven simultaneously, but since bias capability of the first or second non-drive control section is set higher than that of the first or second bias control section, the second or first bias control for not driving the second or first output section can be advanced before the first or second bias for driving the first or second output section. Namely, after the second or first output section is set to non-driving state, the first or second output section is started to be driven and thereby a through-current between the first and second output section can be suppressed.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 2 is a state transition table of NMOS transistors in a bias control section directed to the first embodiment;

FIG. 5 is a state transition table of NMOS transistors in the bias control section directed to the second embodiment;

DETAILED DESCRIPTION OF THE PREFERRED EMBODIMENTS

The first and second embodiments of an output buffer circuit of the present invention will be described in detail with reference to the accompanying drawings FIG. 1 to FIG. 7.

Figure 1:
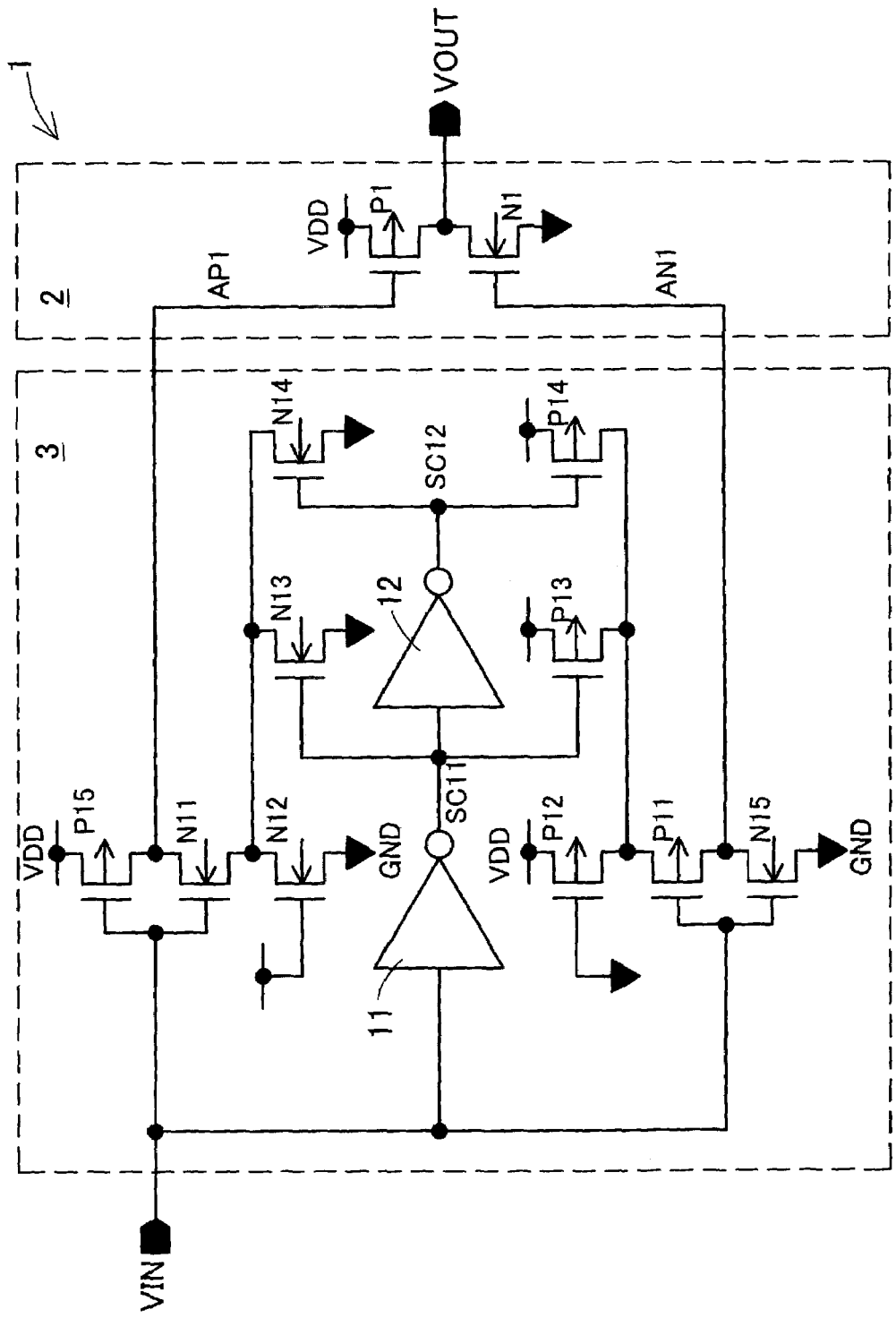
FIG. 1 is a circuit diagram illustrating an output buffer circuit directed to the first embodiment.

An output buffer circuit 1 of the first embodiment of FIG. 1 is configured with inclusion of an output stage transistor section 2 and a bias control section 3.

The output stage transistor section 2 comprises a PMOS transistor P1 which is connected to a power supply voltage VDD at its source terminal and an NMOS transistor N1 which is connected to a ground voltage GND at its source terminal in order to form a so-called CMOS buffer circuit which outputs an output signal VOUT from an output terminal VOUT connected to each drain terminal. The gate terminals AP1, AN1 of the output stage PMOS/NMOS as the gate terminals of the PMOS transistor P1 and NMOS transistor N1 are respectively bias-controlled with the control signals AP1 and AN1 from a bias control section 3.

In the bias control section 3, the bias capability is controlled with the predetermined delay time from the input signal VIN and thereby the control signals AP1 and AN1 are outputted. The input signal VIN is respectively inputted to the gate terminals of the PMOS transistor P15 connected to the power supply voltage VDD at its source terminal, NMOS transistor N11 connected to the drain of the PMOS transistor P15 at its drain terminal, NMOS transistor N15 connected to the ground voltage GND at its source terminal and the PMOS transistor P11 connected to the drain terminal of the NMOS transistor N15 at its drain terminal. Here, the control signal AP1 is outputted from the drain terminals of the PMOS transistor P15 and NMOS transistor N11 and the control signal AN1 is also outputted from the drain terminals of the NMOS transistor N15 and PMOS transistor P11.

The NMOS transistors N12 to N14 are connected in parallel across the source terminal of the NMOS transistor N11 and the ground voltage GND. The gate terminal of NMOS transistor N12 among these transistors is connected to the power supply voltage VDD. In the same manner, the PMOS transistors P12 to P14 are connected in parallel across the source terminal of the PMOS transistor P11 and the power supply voltage VDD and the gate terminal of PMOS transistor P12 is connected to the ground voltage GND. The gate terminals of the NMOS transistor N13, PMOS transistor P13, NMOS transistor N14 and PMOS transistor P14 are respectively connected to form the common gate terminals SC11, SC12. The common gate terminal SC11 is controlled with the input signal VIN via a reverse delay circuit 11 to be delayed and logically reversed, while the common gate terminal SC12 is controlled with the common gate terminal SC11 via a reverse delay circuit 12 to be delayed and logically reversed.

The control signal AP1 is charged to the power supply voltage VDD when the PMOS transistor P15 is turned ON and is then discharged to the ground voltage GND when the NMOS transistor N11, NMOS transistor N12 in the ON state or at least any one transistor of the NMOS transistors N13, N14 in addition to the NMOS transistor N12 are turned ON. In the same manner, the control signal AN1 is discharged to the ground voltage GND when the NMOS transistor N15 is turned ON and is then charged to the power supply voltage VDD when the PMOS transistor P11, the PMOS transistor P12 in the ON state or at least any one transistor of the PMOS transistors P13, P14 in addition to the PMOS transistor P12 are turned ON.

Here, charging capability of the output stage NMOS gate terminal AN1 by the NMOS transistor N15 is set higher than that of the output stage PMOS gate terminal AP1 formed of the NMOS transistor N11 and NMOS transistors N12 to N14 when the NMOS transistor N15 discharges the output stage NMOS gate terminal AN1. In the same manner, charging capability of the output stage PMOS gate terminal AP1 by the PMOS transistor P15 is set higher than that of the output stage NMOS gate terminal AN1 formed of the PMOS transistor P11 and PMOS transistors P12 to P14 when the PMOS transistor P15 charges the output stage PMOS gate terminal AP1.

As described above, the charge/discharge circuit configuration of the output terminal VOUT is in the complementary relationship in the output buffer circuit 1 (FIG. 1). That is, a circuit configuration (P1, P15, N11 to N14) for charging the output terminal VOUT to the power supply voltage VDD and a circuit configuration (N1, N15, P11 to P14) for discharging the output terminal VOUT to the ground voltage GND are similar with each other when the potential relationship and conductivity type of transistors are replaced with each other. Therefore, only the circuit for charging the output terminal VOUT will be described.

FIG. 2 is a state transition table illustrating the ON and OFF stages of the NMOS transistors N11 to N14 in the bias control section 3 resulting from transition of the input signal VIN to the high level. In FIG. 2, "ON" means that a transistor is in the conductive state, while "OFF" means that a transistor is in the non-conductive state.

The transitional states of the NMOS transistors N11, N13, N14 are controlled to the three states (I, II, III) with the input signal VIN and delayed signals SC11, SC12 obtained from the input signal VIN via the reverse delay circuits 11, 12.

In the state I, the input signal VIN shifted to the high level is not propagated to the delayed signals SC11, SC12. Namely, when the input signal VIN is in the high level (VIN=H), the delayed signals SC11, SC12 are respectively in the high level (SC11=H) and low level (SC12=L) depending on the low level state of the input signal VIN before it is level-shifted. Therefore, the input signal VIN and delayed signals SC11, SC12 are inputted to the gate terminal to set the NMOS transistors N11 and N13 to the conductive state ("ON"), while the NMOS transistor 14 to the non-conductive state ("OFF"). The NMOS transistor N12 maintains the conductive state ("ON") in all states (I to III) because the gate terminal thereof is fixed to the power supply voltage VDD.

In the state II, the input signal VIN shifted to the high level is propagated up to the delayed signal SC11 via the reverse delay circuit 11. Namely, the delayed signal SC11 is logically reversed to the low level (SC11=L) for the input signal VIN of the high level (VIN=H). Since the input signal VIN is not propagated to the delayed signal SC12, the delayed signal SC12 is in the state of low level (SC12=L) by receiving the low level state before the input signal VIN is level-shifted. Therefore, the NMOS transistor N11 becomes conductive state ("ON"), while the NMOS transistors N13, N14 become the non-conductive state ("OFF").

In the state III, the input signal VIN shifted to high level is propagated to the delayed signal SC12 via the reverse delay circuits 11, 12. That is, the delayed signal SC11 is logically reversed to low level (SC11=L) against the input signal VIN of high level (VIN=H) and the delayed signal SC12 is further logically reversed to high level (SC12=H). Therefore, the NMOS transistors N11, N14 become conductive state ("ON"), while the NMOS transistor N13 becomes non-conductive state ("OFF").

Figure 3:
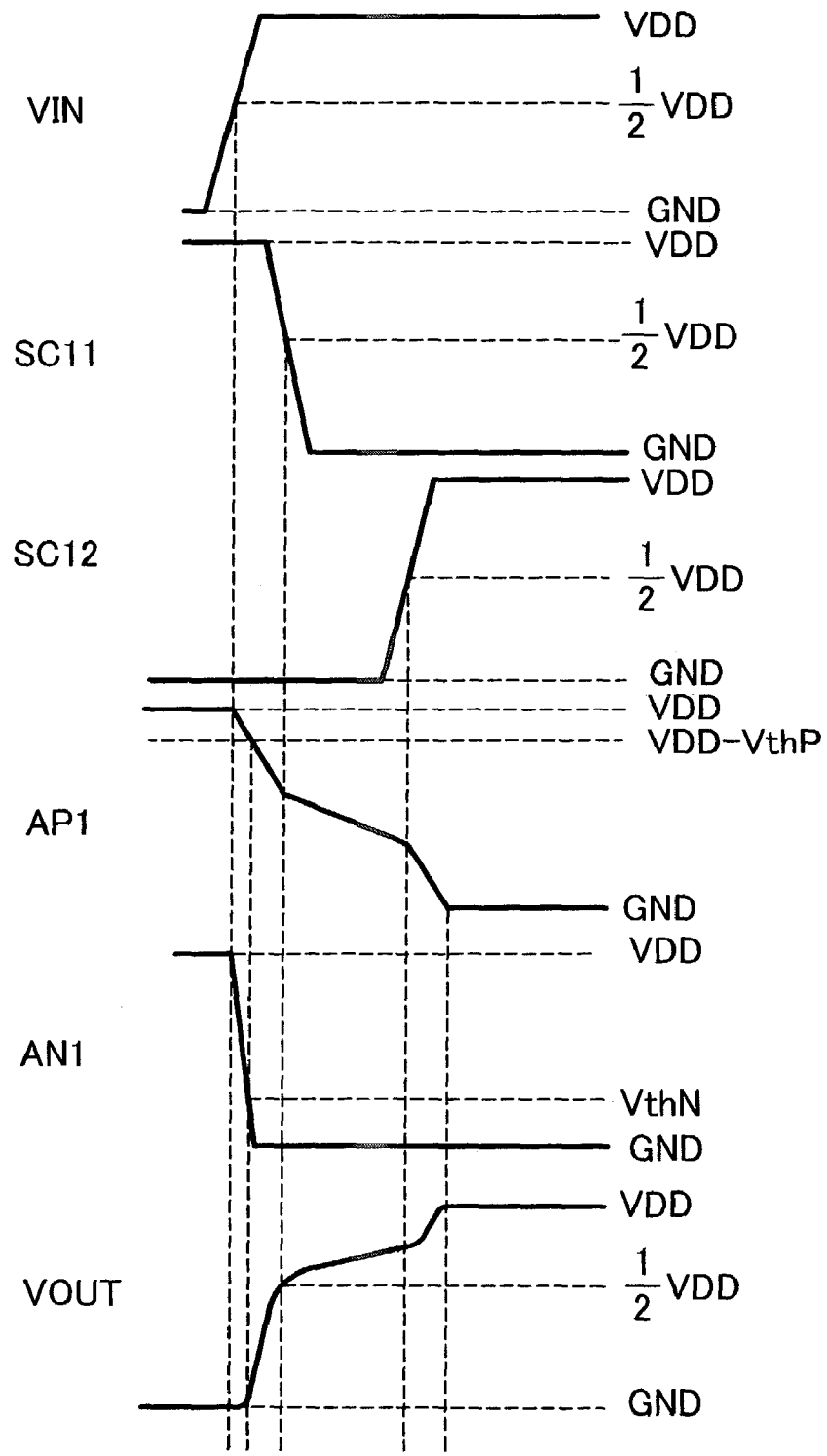
FIG. 3 is an operational waveforms diagram illustrating signal transition operation of the output buffer circuit directed to the first embodiment.

The operational waveforms depending on state transition of the NMOS transistors N11 to N14 illustrated in FIG. 2 are illustrated in FIG. 3. In FIG. 3, it is assumed, for the convenience of description, that each signal exhibits transition of level between the ground voltage GND and the power supply voltage VDD. Moreover, it is also assumed that a logical threshold value of a logical reverse gate formed with inclusion of the reverse delay circuits 11, 12 and PMOS/NMOS transistors P15/N11, P11/N15 is set to the (½) VDD voltage which is an intermediate potential between the ground voltage GND and power supply voltage VDD.

The input signal VIN is shifted to high level, while the delayed signal SC11 which is logically reversed and delayed with the reverse delay circuit 11 is shifted to low level. The period until the shift of delayed signal SC11 to low level from the shift of the input signal VIN to high level is identical to the period of the state I. During this period, the NMOS transistor N11 and the transistors N12, N13 among the NMOS transistors N12 to N14 connected in series to the transistor N11 become conductive state. Since two NMOS transistors N12, N13 are connected in parallel, total current driving capability becomes high. The output stage PMOS gate terminal AP1 is connected to the ground voltage GND with a small conductive resistance and thereby voltage level of the control signal AP1 is lowered sharply.

When voltage level of the control signal AP1 is lowered from the power supply voltage VDD level as much as the threshold voltage VthP of the PMOS transistor P1 of the output stage transistor section 2 (AP1=VDD−VthP), the PMOS transistor P1 starts to become conductive. In the state I, since the voltage level of the control signal AP1 is lowered sharply, the PMOS transistor P1 is quickly gate-biased thereafter and its driving capability is also quickly improved.

At the beginning of the state I, when the input signal VIN is shifted to high level, the NMOS transistor N15 simultaneously starts to shift to the conductive state. Here, it is preferable that current driving capability of the NMOS transistor N15 is set higher than that of the circuit configured with the NMOS transistor N1 and NMOS transistors N12, N13 and thereby when voltage level of the control signal AP1 drops to the level VDD-VthP, voltage level of the control signal AN1 is dropped lower than the threshold voltage VthN of the NMOS transistor N1 of the output stage transistor section 2. Thereby, prior to conductive state of the PMOS transistor P1, the NMOS transistor N1 becomes non-conductive and a through-current during transition of signal level in the output stage transistor section 2 can be suppressed.

During the period of state I, voltage level of the output signal VOUT is set to (½) VDD when the period of state I is completed. Accordingly, the signal can be propagated to the circuit in the receiving side of the next stage, while the period set for the state I is defined as the delay time. In the state I, since driving capability of the PMOS transistor P1 can be maximized by quickly lowering voltage level of the control signal AP1, the output signal VOUT can be level-shifted in the shortest delay time to realize high speed transmission of data.

The delayed signal SC11 shifted to low level is further inputted to the reverse delay circuit 12 to generate the delayed signal SC12 which has been logically reversed and delayed again. The period up to the shift to high level of the delayed signal SC12 from the shift to low level of the delayed signal SC11 corresponds to the state II. During this period, the NMOS transistors N11 and N12 connected in series become conductive. Since the output stage PMOS gate terminal AP1 is discharged through the single current path, current driving capability is more limited than that in the state I. Voltage level of the control signal AP1 drops in the voltage gradient (hereinafter referred to as through-rate) which is more limited than the sharp voltage gradient in the state I.

Moreover, since the PMOS transistor P1 continues to be conductive, voltage level of the output signal VOUT rises and a voltage applied across the source and drain of the PMOS transistor P1 is lowered. Accordingly, current driving capability of the PMOS transistor P1 is limited. On the other hand, since increase rate of voltage applied across the gate and source is also limited, current driving capability of the PMOS transistor P1 is limited in the state II. Rise of voltage level of the output signal VOUT driven by the PMOS transistor P1 is limited to the predetermined through-rate.

After the state I where the signal is propagated to the circuit in the receiving side of the next stage in the shortest delay time by sharply shifting the control signal AP1 to low level and then by sharply shifting the output signal VOUT to high level, in the state II, the through-rate of shift to high level of the output signal VOUT is limited by limiting the through-rate of shift to low level of the control signal AP1. Accordingly, generation of over-shoot/under-shoot of the output signal VOUT itself due to sharp transition to high level of the output signal VOUT and generation of erroneous operation such as mixing of noise to peripheral circuits can be suppressed.

The period to completion of transition to high level of the output signal VOUT from transition to high level of the delayed signal SC12 corresponds to the state III. During this period, the NMOS transistor N11 and transistors N12, N14 among the NMOS transistors N12 to N14 connected in series to the transistor N11 become conductive. Since two NMOS transistors N12, N14 are connected in parallel, total current driving capability becomes high and the output stage PMOS gate terminal AP1 is connected, as in the case of the state I, to the ground voltage GND through a small conductive resistance and the voltage level of the control signal AP1 sharply drops to the ground voltage GND.

In the states I and II, a voltage across the source and drain of the PMOS transistor P1 drops and current driving capability is limited because the PMOS transistor P1 becomes conductive and voltage level of the output signal VOUT rises. However, in the state III, the voltage to be applied across the gate and source is increased to acquire current driving capability of the PMOS transistor P1 by sharply lowering again the control signal AP1. Accordingly, transition to high level of the output signal VOUT becomes sharp and this signal rises up to the power supply voltage VDD within the shortest time. In combination with the state I, the high speed data transmission can be realized.

Figure 4:
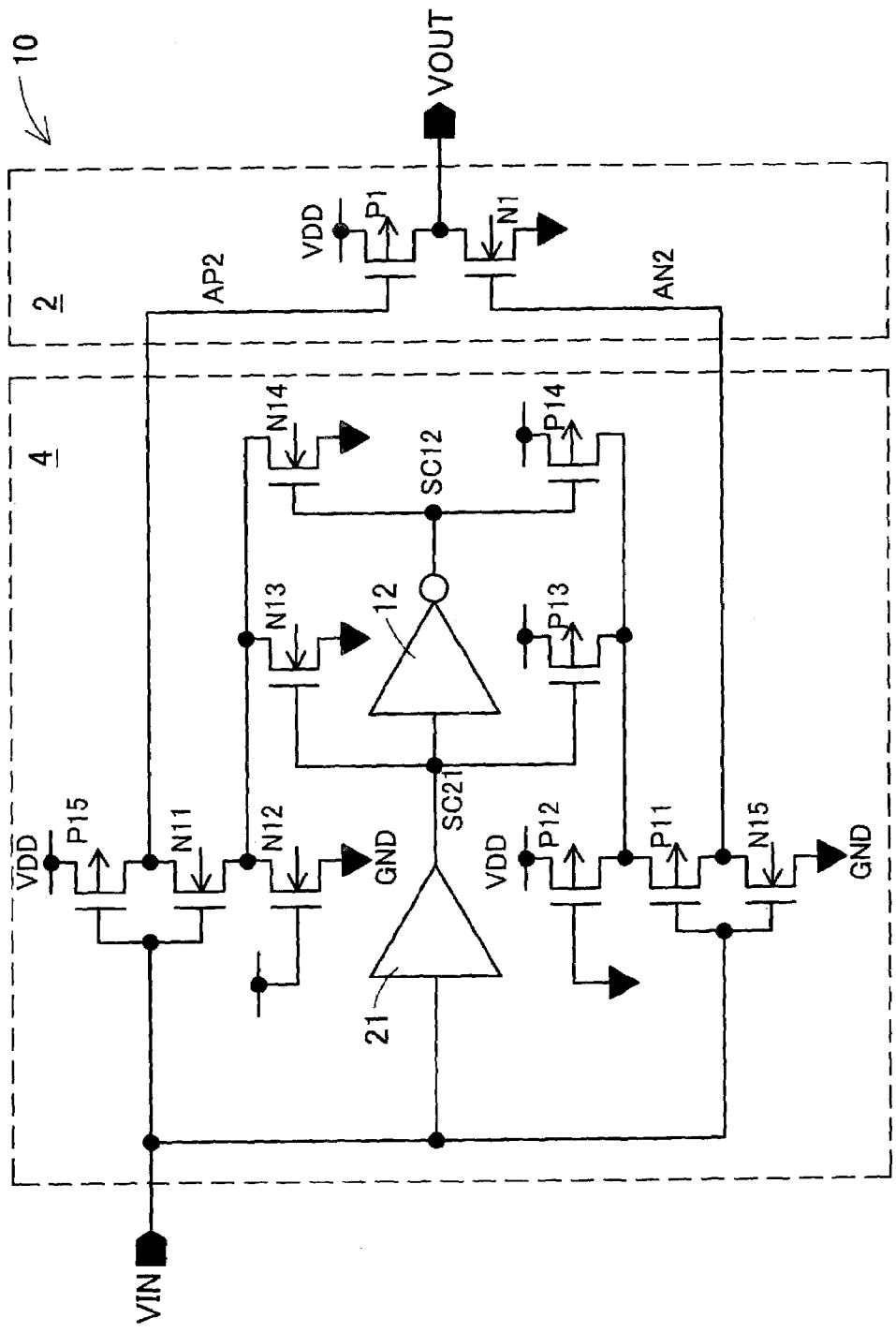
FIG. 4 is a circuit diagram illustrating the output buffer circuit directed to the second embodiment.

Next, FIG. 4 illustrates an output buffer circuit 10 directed to the second embodiment. In this output buffer circuit 10, a bias control section 4 is provided in place of the bias control section 3 directed to the first embodiment. The bias control section 4 is provided with a delay circuit 21 which outputs an output signal of the same phase as the input signal in place of the reverse delay circuit 11 of the bias control section 3. A delayed signal SC21 outputted from the delay circuit 21 is inputted, in place of the delayed signal SC11 in the first embodiment, to the gate terminals of the NMOS transistor N13 and PMOS transistor P13. Description of the other circuit configuration is eliminated here because the other circuit configuration is similar to that of the first embodiment and operates in the same manner resulting in the similar effects.

FIG. 5 illustrates a state transition table of the NMOS transistors N11 to N14 in the bias control section 4 due to transition to high level of the input signal VIN. Similar to the first embodiment illustrated in FIG. 2, the transitional states are classified to the three states (I, II, III).

In the state I, the input signal VIN shifted to high level is not propagated to the delayed signals SC21, SC12. Namely, while the input signal VIN is in high level (VIN=H), the delayed signals SC21, SC12 are respectively in low level (SC21=L) and high level (SC12=H) by receiving low level state of the input signal VIN before the level transition. Therefore, the input signal VIN, delayed signals SC21, SC12 are inputted to the gate terminal setting the NMOS transistors N11 and N14 to the conductive state ("ON"), while the NMOS transistor N13 to non-conductive state ("OFF"). Since the NMOS transistor N12 is fixed to the power supply voltage VDD at its gate terminal, the conductive state ("ON") is maintained for all states (I to III).

In the state II, the input signal VIN shifted to high level is propagated to the delayed signal SC21 via the delay circuit 21. Namely, the delayed signal SC21 is shifted to high level (SC21=H) for the input signal VIN of high level (VIN= H). Since the input signal VIN is not propagated to the delayed signal SC12, the delayed signal SC12 is still in high level (SC12=H). Accordingly, all NMOS transistors N11 to N14 become conductive ("ON").

In the state III, the input signal VIN shifted to high level is propagated to the delayed signal SC12 via the reverse delay circuit 12. Namely, the delayed signal SC21 becomes high level (SC21=H) for the input signal VIN of high level (VIN=H) and the delayed signal SC12 is logically reversed to become low level (SC12=L). Accordingly, the NMOS transistors N11, N13 become conductive ("ON"), while the NMOS transistor N14 becomes non-conductive ("OFF").

Figure 6:
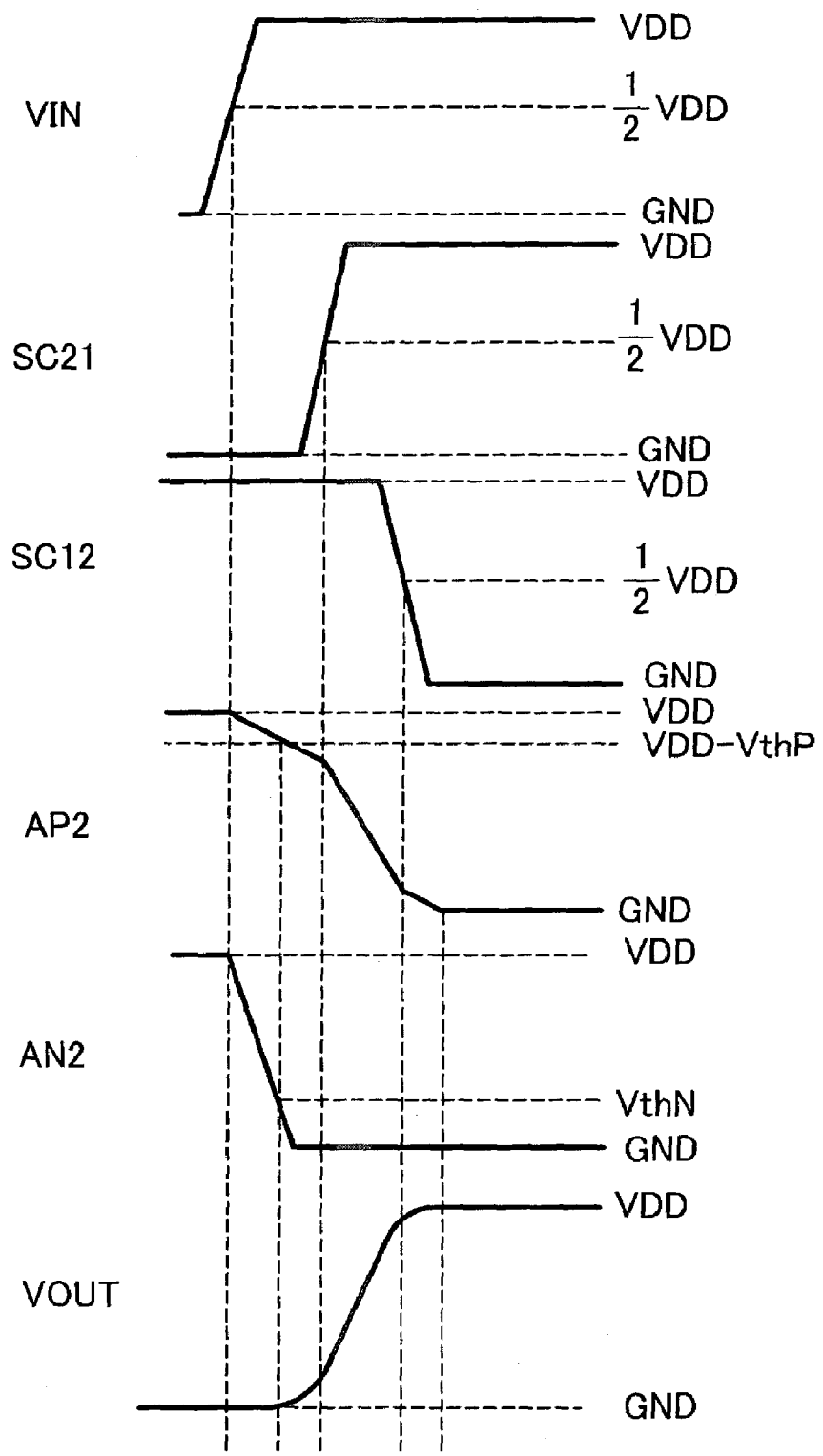
FIG. 6 is an operational waveforms diagram illustrating signal transition operation of the output buffer circuit directed to the second embodiment.

FIG. 6 illustrates operational waveforms of the output buffer circuit 10. Transition of signal level is executed between the ground voltage GND and the power supply voltage VDD and the logical threshold value is set to the point of the (½) VDD voltage as in the case of the first embodiment.

In the period of state I up to the transition to high level of the delayed signal SC21 from transition to high level of the input signal VIN, the NMOS transistor N11 and NMOS transistors N12, N14 become conductive. Voltage level of the control signal AP2 drops in the predetermined through-rate with current driving capability which is set by the NMOS transistor N11 and two NMOS transistors N12, N14 connected in parallel.

When voltage level of the control signal AP2 is lowered from the power supply voltage VDD level as much as the threshold voltage VthP of the PMOS transistor P1 in the output stage transistor section 2 (AP2=VDD−VthP), the PMOS transistor P1 starts to become conductive. In the state I, since voltage level of the control signal AP2 drops in the predetermined through-rate, driving capability of the PMOS transistor P1 increases in the predetermined rate. Voltage level of the output signal VOUT can be increased in the predetermined through-rate.

Moreover, with transition to high level of the input signal VIN, the NMOS transistor N15 also starts to become conductive. Here, it is preferable that current driving capability of the NMOS transistor N15 is set higher than that in the configuration of NMOS transistor N11 and NMOS transistors N12, N14 and voltage level of the control terminal AN2 is set to become lower than the threshold voltage VthN of NMOS transistor N1 when voltage level of the control signal AP2 drops to VDD−VthP. Accordingly, before the PMOS transistor P1 becomes conductive, the NMOS transistor N1 becomes non-conductive to suppress a through-current during transition of signal level in the output stage transistor section 2. In the output buffer circuit 10 of the second embodiment, since voltage level of the control signal AP2 in the state I drops in the predetermined through-rate, a certain allowable time is prepared for drop of the control signal AN2 in comparison with sharp drop of voltage level in the first embodiment and current driving capability of the NMOS transistor N15 can be set smaller than that in the first embodiment.

Generation of over-shoot and under-shoot when transition of signal is driven can be suppressed by starting transition of voltage level of the output signal VOUT in the predetermined through-rate which is not so sharp.

In the period of state II up to transition to low level of the delayed signal SC12 from transition to high level of the delayed signal SC21, the NMOS transistor N11 and NMOS transistors N12 to N14 become conductive. Since three transistors N12 to N14 connected in parallel become conductive, total current driving capability becomes higher. The output stage PMOS gate terminal AP2 is connected to the ground voltage GND through a small conductive resistance to sharply drop voltage level of the control signal AP2.

Since driving capability of the PMOS transistor P1 can be maximized by sharply dropping voltage level of the control signal AP2, voltage level of the output signal VOUT can be quickly shifted to (½) VDD voltage and the signal can also be propagated quickly to the circuit in the receiving side of the next stage. After generation of over-shoot and under-shoot in the output signal VOUT is suppressed by setting transition of voltage level to the predetermined through-rate when transition of voltage of the output signal VOUT is started, the output signal VOUT can be shifted in the shortest delay time and thereby high speed data transmission can be realized.

In the period of state III up to completion of transition to high level of the output signal VOUT from transition to low level of the delayed signal SC12, the NMOS transistor N11 and NMOS transistors N12, N13 become conductive. In this case, the output stage PMOS gate terminal AP2 is discharged in current driving capability like that in the state I and thereby voltage level of the control signal AP2 drops in the predetermined through-rate. Generation of over-shoot and under-shoot when transition of signal level is completed can be suppressed by completing transition of voltage level of the output signal VOUT in the predetermined through-rate which is not so sharp.

In the first and second embodiment, the continuation period of the states I to III is set depending on the delay times which are set in the reverse delay circuits 11, 12 and delay circuit 21. Here, it is further preferable that the continuation period of the states I to III can be adjusted depending on the operation specifications such as delay time in the signal propagation and over-shoot/under-shoot in accordance with the characteristic impedance of transmission line including data bus and on the signal propagation line including an input impedance or the like of the circuit in the receiving side. This adjustment may be set previously in the circuits such as the reverse delay circuits 11, 12 or the delay circuit 21, etc. and moreover this adjustment can also be set with external circuits illustrated in FIGS. 7(A) and 7(B).

Figure 7A:
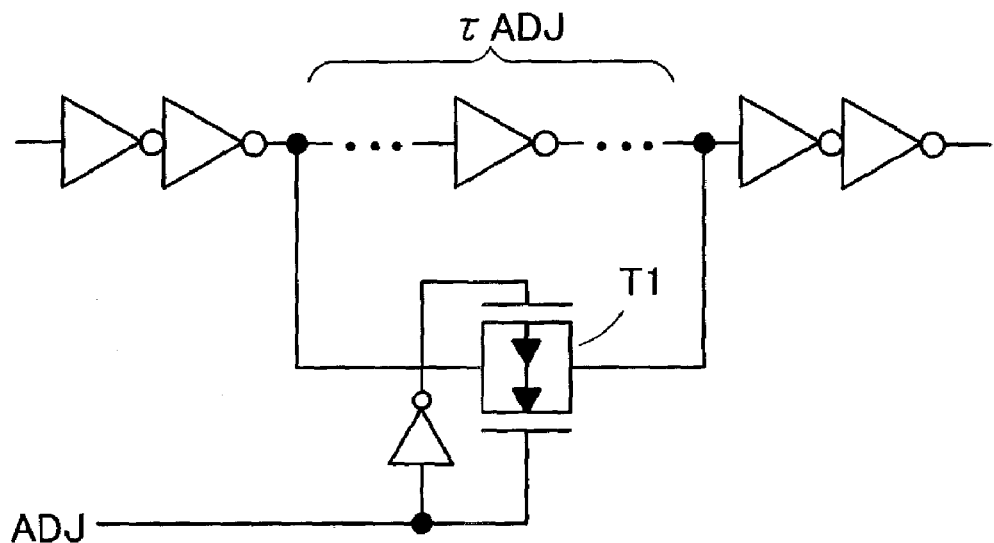
FIG. 7 is a circuit diagram illustrating an example of adjustment of delay time.

FIG. 7(A) illustrates a type of adjustment of delay time with an adjustment signal ADJ. A transfer gate T1 is provided between the train of inverter gates of the predetermined number of stages for clocking an adjustment delay time τ ADJ among the inverter gates which are delay elements for clocking one unit of the delay time. The adjustment delay time τ ADJ can be added or subtracted to or from the delay time by controlling the conductive state of the transfer gate T1 with the adjustment signal ADJ from external circuits. FIG. 7(A) shows an example where the adjustment delay time can be added or subtracted by providing a plurality of transfer gates to control conductive state of each gate.

Figure 7B:
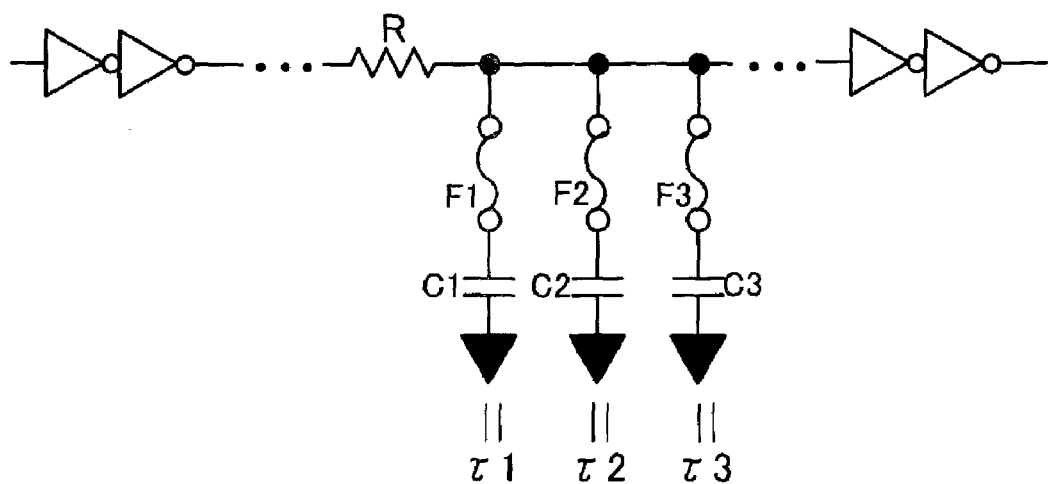
Figure 8:
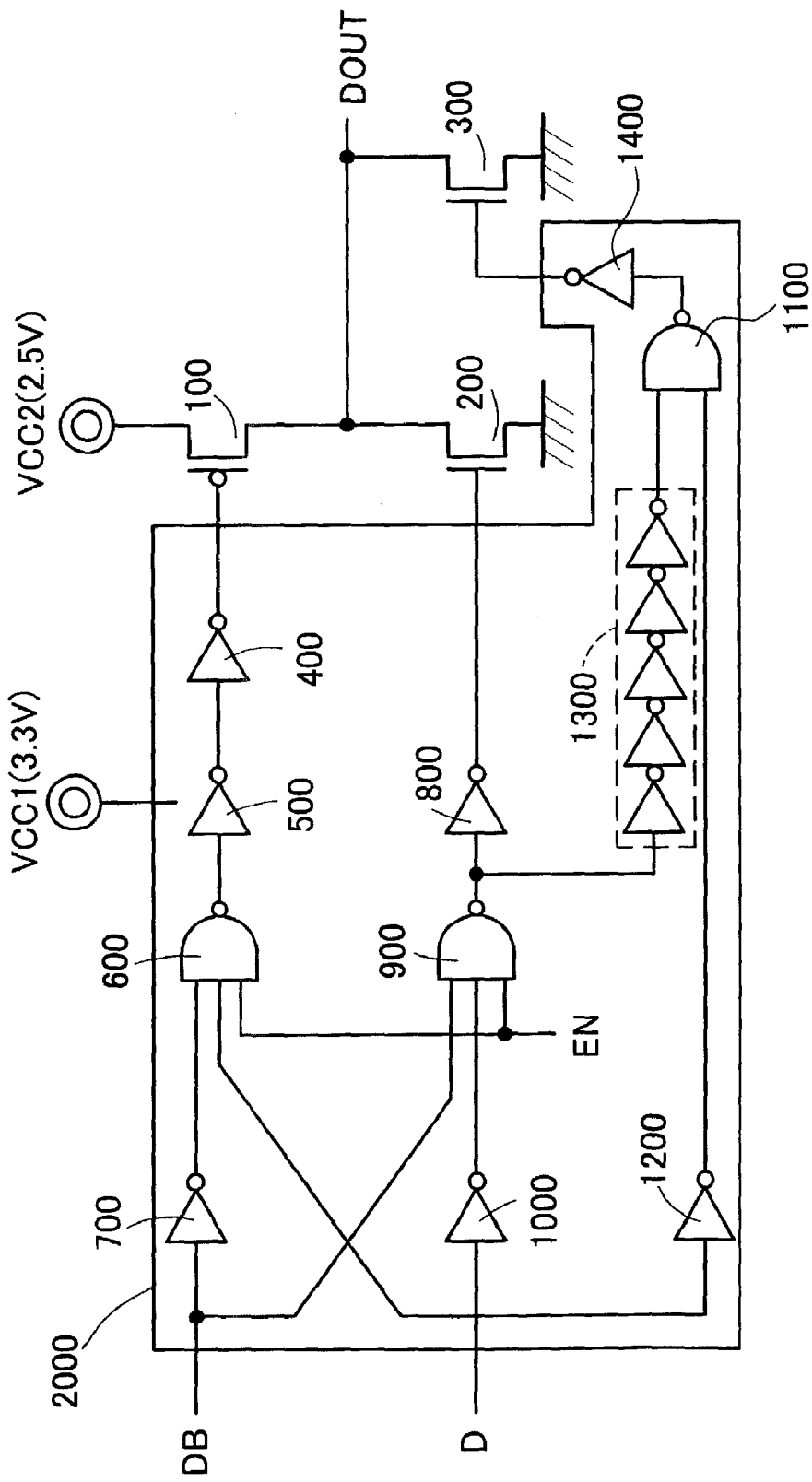
FIG. 8 is a circuit diagram illustrating the output circuit of the prior art.

FIG. 7(B) illustrates a type of adjustment of delay time with blowing of fuses. Capacitance element to be connected among the capacitance elements C1 to C3 which is forming a CR delay circuit as the delay element is adjusted with blowing of fuses. In FIG. 7(B), when the fuses F2, F3 blow but a fuse F1 does not yet blow, a capacitance element C1 and a resistance element R form a delay element to set the delay time τ1. In the same manner, when a fuse F2 does not yet blow, a capacitance element C2 is connected to form a delay time τ2 and when a fuse F3 does not yet blow, a capacitance element C3 is connected to set a delay time τ3. Moreover, a plurality of fuses do not blow, a plurality of capacitance elements are connected to provide a total sum of the delay time described above.

It is also possible that conductive state of the transfer gate is controlled with blowing conditions of fuses and connecting condition of capacitance elements is set with an adjustment signal using a switch circuit such as a MOS transistor or the like. Moreover, it is of course possible to adequately combine the types (A) and (B).

Moreover, an inverter gate and a CR delay circuit are used as the delay elements in above description but a delay time can also be clocked by another way, namely by the other logical gates which require the predetermined time for signal propagation, or by adding a capacitance load to the signal propagation node so that the predetermined time is required for transition of voltage level of the signal propagation node or by limiting driving capability of the driving stage.

Effects of the output buffer circuits 1 and 10 of the first and second embodiments described above will be confirmed hereunder. For the convenience of description, drive control of the PMOS transistor P1 will be mainly described but the present invention surely provides the similar effects for the NMOS transistor N1.

According to the output buffer circuits 1 and 10 of the first and second embodiments, driving capability of the PMOS transistor P1 in the output stage transistor section 2 as the output section can be variably controlled by controlling the control signals AP1, AP2 which are bias voltages applied to the output stage PMOS gate terminals AP1, AP2.

Moreover, the NMOS transistors N12 to N14 as the bias control transistor which turns ON can be selected depending on each period of the states I to III of the predetermined period and current driving capability of the bias control MOS transistor for biasing the output stage PMOS gate terminals AP1, AP2 can be adjusted depending on each period of the states I to III.

Since the output stage PMOS gate terminals AP1, AP2 are connected to the ground voltage GND as the steady bias voltage by changing over the NMOS transistors N12 to N14 which turn ON and by changing over the number of transistors which turn ON depending on each period of the states I to III, current driving capability across the output stage PMOS gate terminals AP1, AP2 and the ground voltage GND changes for every switching of conductive state among the NMOS transistors N12 to N14 to change charging/discharging speed to and from the output stage PMOS gate terminals AP1, AP2. Change with time of voltage of the control signals AP1, AP2 at the output stage PMOS gate terminals AP1, AP2 can be adjusted by adjusting each period of the states I to III and driving capability of the PMOS transistor P1 can be adjusted depending on change with time of the gate bias condition of the PMOS transistor P1. Driving capability of the PMOS transistor P1 during the level transition period can be adjusted accurately depending on the voltage transition state to the power supply voltage VDD which depends on the characteristic impedance on the transmission line including data bus or signal propagation line connected to the output terminal VOUT and including an input impedance of the circuit in the receiving side of the next stage. Thereby, excellent voltage transition characteristic in which the propagation delay is shortened and any disturbance of waveform such as over-shoot/under-shoot is eliminated can be obtained.

Moreover, when transition of the output stage PMOS gate terminals AP1, AP2 is not executed, the NMOS transistor N11 as the drive control NMOS transistor can be maintained in non-conductive state and unwanted charge/discharge operation to the output stage PMOS gate terminals AP1, AP2 can be prevented without relation to the conductive state of the NMOS transistors N12 to N14.

In addition, since logical levels of a plurality of delayed signals SC11 and SC12, or SC21 and SC12 outputted from the predetermined position of the reverse delay circuits 11 and 12, or delay circuit 21 and reverse delay circuit 12 are adjusted depending on the number of multi-stage connections of the delay elements such as CR delay circuit or inverter gate which changes the logical level of the input/output signals to in-phase or opposite phase, the conductive state and non-conductive state of the NMOS transistors N13 and N14 to which individual delay signal is inputted can be switched before and after the delayed signals SC11 and SC12, or SC21 and SC12. The conductive state of the NMOS transistors N13 and N14 may be switched for every delay time during the transition period to the power supply voltage VDD at the output terminal VOUT by adjusting the setting of delay time of the reverse delay circuits 11 and 12 or delay circuit 21 and reverse delay circuit 12 and setting of logical level of the delayed signals SC11 and SC12, or SC21 and SC12. Driving capability of the PMOS transistor P1 can be accurately adjusted during the transition period depending on the characteristic impedance on the signal propagation line connected to the output terminal VOUT and thereby excellent voltage transition characteristic can be obtained.

Moreover, since the NMOS transistor N1 as the second output section is not driven by controlling the control signals AN1, AN2 as the second bias with the NMOS transistor N15 as the first non-drive control section before the PMOS transistor P1 is started to be driven through the control signals AP1, AP2 as the first bias to the PMOS transistor P1 as the first output section, the PMOS/NMOS transistors P1, N1 are never driven simultaneously and thereby a through-current between the power supply voltage VDD and ground voltage GND as the first and second predetermined voltages can be suppressed.

In this case, the NMOS transistors N11 and N12 to N14 to drive the PMOS transistor P1 and the NMOS transistor N15 which does not drive the NMOS transistor N1 are driven simultaneously, but since current driving capability of the NMOS transistor N15 is set higher than that of the NMOS transistors N11 and N12 to N14, voltages of the control signals AN1, AN2 for not driving the NMOS transistor N1 is dropped preceding the voltage drop of the control signals AP1, AP2 for driving the PMOS transistor P1. Namely, after the NMOS transistor N1 is not driven, the PMOS transistor P1 is started to be driven and a through-current among transistors is suppressed. In this timing, it is not requested to provide an exclusive delay circuit or the like to shift the operation timings of the transistors in the non-conductive side and the conductive side.

Moreover, according to the output buffer circuit 1 of the first embodiment, sharp signal transition can be realized by setting higher driving capability of the PMOS transistor P1 during the period of the state I which is the first predetermined time from start of voltage transition of the output voltage VOUT and thereby the delay time up to voltage transition to the threshold voltage in the circuit of the receiving side in the next stage connected to the output terminal VOUT can be shortened. Simultaneously, driving capability of the PMOS transistor P1 can be set smaller than that in the period of state I during the period of state II which is the second predetermined time after the circuit in the receiving side of the next stage has detected voltage transition, the through-rate which indicates voltage transition speed in the period of state II can be set lower than that in the period of state I. Accordingly, generation of over-shoot/under-shoot of the signal due to voltage transition of the output voltage VOUT can be suppressed. In the circuit in the receiving side of the next stage, voltage transition can be detected at a higher speed in the reduced delay time and generation of erroneous detection due to disturbance of signal voltage level such as over-shoot/under-shoot can also be suppressed.

Moreover, according to the output buffer circuit 10 of the second embodiment, signal transition can be realized in the predetermined through-rate by limiting driving capability of the PMOS transistor P1 in the period of state I from the start of voltage transition of the output terminal VOUT and thereby generation of over-shoot/under-shoot of the signal at the time of starting voltage transition can be suppressed. Simultaneously, since driving capability of the PMOS transistor P1 can be set higher than that in the period of state I during the period of state II, sharp voltage transition at the output terminal VOUT can be realized and delay time for voltage transition up to the threshold voltage in the circuit of the receiving side in the next stage can be shortened. In the circuit of receiving side in the next stage, generation of erroneous detection due to disturbance of signal voltage level such as over-shoot/under-shoot during voltage transition of the output terminal VOUT can be suppressed and voltage transition can be detected within the reduced delay time.

The present invention is never limited only to the first and second embodiments and allows, of course, various changes and modifications within the range not departing from the scope of the present invention.

For example, in the first and second embodiments, structure of the output stage transistor CMOS of the output buffer circuits 1, 2 are described as an example, but the output stage transistor is not limited thereto. The present invention can also be applied to the output stage including the bi-CMOS structure and circuit structure of the other voltage control drive.

Moreover, the NMOS transistors N12 to N14 and PMOS transistors P12 to P14 provided as the bias control transistors are configured by connecting in parallel three transistors in this example, but the present invention is never limited thereto. Similar operations and effects can naturally be attained even in the case where two transistors or four or more transistors are connected in parallel. In addition, in regard to current driving capability of structural transistors, similar operations and effects can also be attained even in the structure that the transistors of the same size are connected in parallel and that the transistors of different current driving capabilities are provided.

In addition, in the circuit configuration where a bipolar transistor is used as the output stage transistor and the other current control drive is introduced, similar operations and effects can also be attained by switching a current value of the bias current as the control signal.

According to the present invention, it is possible to provide the output buffer circuit which can realize high speed voltage transition of output signal while generation of noise due to signal transition is suppressed.

What is claimed is:

1. An output buffer circuit comprising:
   an output section for driving an output terminal which outputs a binary signal to a plurality of predetermined voltages; and
   a bias control section for variably controlling driving capability of the output section by variably controlling a bias to drive the output section in a transition period where the output terminal reaches one of the predetermined voltages,
   wherein the bias control section comprises:
   a plurality of bias control MOS transistors for varying the bias to drive the output section; and
   a timer section for providing a predetermined time where the plurality of the bias control MOS transistors are to be turned ON within the transition period,
   wherein the predetermined time includes a first predetermined time from a start of the transition period during which a first predetermined number of transistors among the plurality of the bias control MOS transistors are conductive and a second predetermined time after the first predetermined time during which a second predetermined number of transistors among the plurality of the bias control MOS transistors are conductive,
   wherein conducting capability of the first predetermined number of transistors is higher than that of the second predetermined number of transistors.

2. The output buffer circuit according to claim 1, wherein the output section includes an output MOS transistor and the bias is a bias voltage applied to a gate terminal of the output MOS transistor.

3. The output buffer circuit according to claim 2, wherein the plurality of the bias control MOS transistors are connected in parallel between the gate terminal of the output MOS transistor and a steady bias voltage and thereby the plurality of the bin control MOS transistors to be turned ON change depending on the predetermined time.

4. The output buffer circuit according to claim 3, wherein at least one drive control MOS transistor which turns ON during the transition period is further provided between the gate terminal and the plurality of the bias control MOS transistors.

5. The output buffer circuit according to claim 1, wherein the timer section includes a delay circuit having a plurality of delay elements for changing in-phase and opposite phase of the logical states between an input signal and an output signal, the plurally of delay elements are connected in multiple stages and the plurally of the bias control MOS transistors are sequentially controlled for conductivity with a plurally of delayed signals outputted from the plurally of delay elements in the delay circuit.

6. An output buffer circuit comprising:
   an output section for driving an output terminal which outputs a binary signal to a plurally of predetermined voltages; and
   a bias control section for variably controlling driving capability of the output section by variably controlling a bias to drive the output section in a transition period where the output terminal reaches one of the predetermined voltages,
   wherein the bias control section comprises:
   a plurality of bias control MOS transistors for varying the bias to drive the output section; and
   a timer section for providing a predetermined time where the plurality of the bias control MOS transistors are to be turned ON within the transition period,
   wherein the predetermined time includes a first predetermined time from a start of the transition period during which a first predetermined number of transistors among the plurality of the bias control MOS transistors are conductive and a second predetermined time after the first predetermined time during which a second predetermined number of transistors among the plurality of the bias control MOS transistors are conductive, wherein conducting capability of the first predetermined number of transistors is lower than that of the second predetermined number of transistors.

7. The output buffer circuit according to claim 6, wherein the output section includes an output MOS transistor and the bias is a bias voltage applied to a gate terminal of the output MOS transistor.

8. The output buffer circuit according to claim 7, wherein the plurality of the bias control MOS transistors are connected in parallel between the gate terminal of the output MOS transistor and a steady bias voltage and thereby the plurality of the bias control MOS transistors to be turned ON change depending on the predetermined time.

9. The output buffer circuit according to claim 8, wherein at least one drive control MOS transistor which turns ON during the transition period is further provided between the gate terminal and the plurality of the bias control MOS transistors.

10. The output buffer circuit according to claim 6, wherein the timer section includes a delay circuit having a plurality of delay elements for changing in-phase and opposite phase of the logical states between an input signal and an output signal, the plurality of delay elements are connected in multiple stages and the plurality of the bias control MOS transistors are sequentially controlled for conductivity with a plurality of delayed signals outputted from the plurality of delay elements in the delay circuit.

11. An output buffer circuit comprising:
a first output section for driving an output terminal to output a binary signal to a first predetermined voltage;
a second output section for driving the output terminal to a second predetermined voltage;
a first bias control section for variably controlling driving capability of the first output section by variably controlling a first bias to drive the first output section in a first transition period in which the output terminal reaches the first predetermined voltage;
a second bias control section for variably controlling driving capability of the second output section by variably controlling a second bias to drive the second output section in a second transition period in which the output terminal reaches the second predetermined voltage;
a first OFF control section driven simultaneously with the first bias control section for controlling the second output section to be non-conductive by controlling the second bias before the first output section is driven;
a second OFF control section driven simultaneously with the second bias control section for controlling the first output section to be non-conductive by controlling the first bias before the second output section is driven,
wherein the first bias control section and the second bias control section comprise:
a first plurality of bias control MOS transistors for the first bias control section for varying the first bias to drive the first output section;
a second plurality of bias control MOS transistors for the second bias control section for varying the second bias to drive the second output section; and
a timer section common to the first bias control section and the second bias control section, for providing a predetermined time where the first and second plurality of the bias control MOS transistors are to be turned ON within the first and second transition period, respectively,
wherein the predetermined time includes a first predetermined time from a start of the first and second transition period during which a first predetermined number of transistors among the first and second plurality of the bias control MOS transistor are conductive respectively and a second predetermined time after the first predetermined time during which a second predetermined number of transistors among the first and second plurality of the bias control MOS transistors are conductive respectively,
wherein conducting capability of the first predetermined number of transistors is higher than that of the second predetermined number of transistors.

12. The output buffer circuit according to claim 11, wherein the first output section includes a first output MOS transistor and the first bias is a first bias voltage to be applied to a gate terminal of the first output MOS transistor, and, the second output section includes a second output MOS transistor and the second bias is a second bias voltage to be applied to a gate terminal of the second output MOS transistor.

13. An output buffer circuit comprising:
a first output section for driving an output terminal to output a binary signal to a first predetermined voltage;
a second output section for driving the output terminal to a second predetermined voltage;
a first bias control section for variably controlling driving capability of the first output section by variably controlling a first bias to drive the first output section in a first transition period in which the output terminal reaches the first predetermined voltage;
a second bias control section for variably controlling driving capability of the second output section by variably controlling a second bias to drive the second output section in a second transition period in which the output terminal reaches the second predetermined voltage;
a first OFF control section driven simultaneously with the first bias control section for controlling the second output section to be non-conductive by controlling the second bias before the first output section is driven;
a second OFF control section driven simultaneously with the second bias control section for controlling the first output section to be non-conductive by controlling the first bias before the second output section is driven,
wherein the first bias control section and the second bias control section comprise:
a first plurality of bias control MOS transistors for the first bias control section for varying the first bias to drive the first output section;
a second plurality of bias control MOS transistors for the second bias control section for varying the second bias to drive the second output section; and
a timer section common to the first bias control section and the second bias control section, for providing a predetermined time where the first and second plurality of the bias control MOS transistors are to be turned ON within the first and second transition period, respectively,
wherein the predetermined time includes a first predetermined time from a start of the first and second transition period during which a first predetermined number of transistors among the first and second plurality of the bias control MOS transistor are conductive respectively and a second predetermined time after the first predetermined time during which a second predetermined number of transistors among the first and second plurality of the bias control MOS transistors are conductive respectively, wherein conducting capability of the first predetermined number of transistors is lower than that of the second predetermined number of transistors.

14. The output buffer circuit according to claim 13, wherein the first output section includes a first output MOS transistor and the first bias is a first bias voltage to be applied to a gate terminal of the first output MOS transistor, and the second output section includes a second output MOS transistor and the second bias is a second bias voltage to be applied to a gate terminal of the second output MOS transistor.

* * * * *